US012695287B2

(12) United States Patent
Schreitmueller et al.

(10) Patent No.: US 12,695,287 B2
(45) Date of Patent: Jul. 28, 2026

(54) ELECTRIC FUSE FOR AN AIRCRAFT SOLID STATE POWER CONTROLLER AND AIRCRAFT SOLID STATE POWER CONTROLLER COMPRISING AN ELECTRIC FUSE

(71) Applicant: HS Elektronik Systeme GmbH, Nördlingen (DE)

(72) Inventors: Stefan Schreitmueller, Auhausen (DE); Denny Friese, Neresheim-Elchingen (DE)

(73) Assignee: HS ELEKTRONIK SYSTEME GMBH, Nördlingen (DE)

( * ) Notice: Subject to any disclaimer, the term of this patent is extended or adjusted under 35 U.S.C. 154(b) by 115 days.

(21) Appl. No.: 18/629,256

(22) Filed: Apr. 8, 2024

(65) Prior Publication Data

US 2024/0339823 A1     Oct. 10, 2024

(30) Foreign Application Priority Data

Apr. 6, 2023     (EP) ..................................... 23166933

(51) Int. Cl.
| | |
|---|---|
| *H02H 3/08* | (2006.01) |
| *B64D 47/00* | (2006.01) |
| *H05K 1/18* | (2026.01) |

(52) U.S. Cl.
CPC .............. *H02H 3/08* (2013.01); *B64D 47/00* (2013.01); *H05K 1/18* (2013.01); *H05K 2201/10053* (2013.01)

(58) Field of Classification Search
CPC . H02H 3/08; B64D 47/00; H05K 1/18; H05K 2201/10053; H01H 85/17; H01H 85/1755; H01H 85/18; H01H 85/463; H01H 85/12; H01H 2085/0275; H01H 2085/0283; H01H 85/0241
(Continued)

(56) References Cited

U.S. PATENT DOCUMENTS

| | | | |
|---|---|---|---|
| 8,390,972 B2 | 3/2013 | Simper et al. | |
| 8,724,325 B2 | 5/2014 | Schnetker et al. | |

(Continued)

FOREIGN PATENT DOCUMENTS

| | | |
|---|---|---|
| DE | 112017007994 T5 | 6/2020 |
| DE | 102023113270 A1 | 11/2023 |
| GB | 2552983 A | 2/2018 |

OTHER PUBLICATIONS

European Search Report for Application No. 23166933.4, mailed Oct. 16, 2023, 7 pages.

(Continued)

*Primary Examiner* — Dharti H Patel
(74) *Attorney, Agent, or Firm* — CANTOR COLBURN LLP

(57) ABSTRACT

An electric fuse for an aircraft solid-state power controller comprising at least one electric conductor, which is connected between an electric input terminal and an electric output terminal, and which is configured to blow when an electric current (I) flowing through the at least one electric conductor exceeds a predefined threshold ($I_{max}$). The at least one electric conductor is encapsulated in a potting and at least one outer surface of the potting is covered with a polymeric coating.

19 Claims, 4 Drawing Sheets

(58) Field of Classification Search
USPC ......................................................... 361/104
See application file for complete search history.

(56) References Cited

U.S. PATENT DOCUMENTS

| | | | | |
|---|---|---|---|---|
| 12,009,336 | B2 * | 6/2024 | Chowdhury | ....... H01H 85/0241 |
| 2020/0234905 | A1 | 7/2020 | Shirakata et al. | |
| 2023/0036643 | A1 | 2/2023 | Chowdhury et al. | |
| 2023/0231289 | A1 * | 7/2023 | Scharner | ............. H01M 50/543 |
| | | | | 429/7 |
| 2024/0339823 | A1 * | 10/2024 | Schreitmueller | ...... B64D 47/00 |
| 2024/0358074 | A1 * | 10/2024 | Batista | ................... A24F 40/46 |

OTHER PUBLICATIONS

European Notice of Allowance for Application No. 23166933.4, mailed Mar. 6, 2026, 29 pages.

* cited by examiner

ELECTRIC FUSE FOR AN AIRCRAFT SOLID STATE POWER CONTROLLER AND AIRCRAFT SOLID STATE POWER CONTROLLER COMPRISING AN ELECTRIC FUSE

CROSS REFERENCE TO RELATED APPLICATIONS

This application claims priority to European Patent Application No. 23166933.4 filed Apr. 6, 2023, the entire contents of which is incorporated herein by reference.

TECHNICAL FIELD

The present invention is related to an electric fuse for an aircraft solid-state power controller and to an aircraft solid-state power controller comprising such an electric fuse. The present invention is further related to an aircraft comprising an electric fuse and/or an aircraft solid-state power controller according to an exemplary embodiment of the invention.

BACKGROUND

Modern aircraft often comprise at least one aircraft power controller, in particular an aircraft solid-state power controller ("SSPC"), for controlling the supply of electric power from an electric power supply to at least one electric load within an aircraft. The aircraft solid-state power controller may comprise solid-state switches for selectively switching the supply of electric power from the electric power supply to the at least one electric load.

In cause of a malfunction within the electric system, an excessively large electric current ("overcurrent") may flow through a solid-state switch of an aircraft power controller. Such an overcurrent may cause overheating of the solid-state switch and result in damaging the solid-state switch and/or electric wires connected to the solid-state switch. The solid-state switches of an aircraft power controller are therefore configured to switch off in case an overcurrent is detected.

A malfunction of the solid-state switches may, however, prevent the solid-state switches from switching off in case of an excessively large electric current.

Aircraft power controllers are therefore additionally equipped with at least one electric fuse providing a "secondary protection" in case an error prevents the solid-state switches of the aircraft power controller from switching off in case of an overcurrent.

An electric fuse, as it may be employed in an aircraft power controller, may comprise an electric conductor, which is configured to melt if an electric overcurrent occurs. The melting of the electric conductor interrupts the flow of any electric currents through the electric conductor thereby terminating the electric overload situation.

In particular in case of large overcurrents, there is a risk that the at least one electric conductor not only melts, but even evaporates and/or explodes. There is a further risk that an electric arc is formed between the remaining ends of the electric conductor. Debris from the evaporation/explosion may cause further damage to the aircraft power controller, and the formation of an electric arc (which is itself electrically conductive) between the remaining ends of the electric conductor may delay the interruption of the electric current flowing through the fuse.

It would therefore be beneficial to provide an improved electric fuse for an aircraft power controller, which, once tripped, securely confines any debris from the electric conductor and/or which suppresses the formation of an electric arc formed between the remaining ends of the electric conductor.

SUMMARY

According to an exemplary embodiment of the invention, an electric fuse for an aircraft solid-state power controller comprises at least one electric conductor, which is connected between an electric input terminal and an electric output terminal of the electric fuse, and which is configured to blow, i.e. melt and/or evaporate, when an electric current flowing through the at least one electric conductor exceeds a predefined threshold. The at least one electric conductor is encapsulated in a potting comprising a polymeric potting material, and at least one outer surface of the potting is covered with a coating comprising a polymeric coating material. Particularly, the polymeric coating material may be different from the polymeric potting material.

Exemplary embodiments of the invention also include a method of forming an electric fuse on an aircraft electric circuit board comprising at least two electric paths, wherein the method includes: connecting at least two of the electric paths with at least one electric conductor, wherein the at least one electric conductor is configured to blow, i.e. melt and/or evaporate, when an electric current flowing through the at least one electric conductor exceeds a predefined threshold. The method further includes encapsulating the at least one electric conductor in a potting comprising a polymeric potting material; and coating at least one outer surface of the potting with a coating comprising a polymeric coating material. Particularly, the polymeric coating material may be different from the polymeric potting material.

The coating is configured to reinforce the at least one outer surface of the potting, in a configuration where the fuse has blown and the electric conductor has melted/evaporated. Particularly, the polymeric coating is capable of being deformed or extended when the fuse has blown, i.e. the electric conductor has melted/evaporated, thereby subjecting the polymeric potting material and the polymeric coating material to stress/load and heat, possibly also producing debris. In that sense, the coating is made from a polymeric coating material being ductile or elastic, at least when being subject to compressive load, shear stress and/or heat.

In other words, being deformable or extendable, the polymeric coating is capable of changing its shape and/or volume when subject to at least one of a compressive load, shear stress and heat. The deformation or expansion of the polymeric coating prevents the polymeric potting material from exploding, and debris from the polymeric potting material and/or from the electric conductor from being ejected from the fuse towards the environment, once the at least one electric conductor melts/evaporates due to an electric overcurrent flowing through the at least one electric conductor. The polymeric potting material and/or the polymeric coating material may further enclose, bind and/or absorb gases, which may be generated when the at least one electric conductor melts/evaporates and/or explodes.

In consequence, the polymeric coating material, which has been applied to the at least one outer surface of the potting to form a polymeric coating, prevents the environment of the electric fuse from being negatively affected by the melting and/or evaporation of the at least one electric conductor due to an excessive electric overcurrent flowing through the at least one electric conductor.

The polymeric coating material may be configured to further prevent the formation of an electric arc between the remaining ends of the at least one melted/evaporated electric conductor, or it may at least shorten the lifetime of such an electric arc. In consequence, the electric current flowing through the at least one electric conductor may be interrupted faster, and the generation of heat and light by an electric arc may be prevented or at least reduced compared to a conventional fuse embedded in a potting material that does not comprise a polymeric coating applied to the potting material.

As a result, an electric fuse according to exemplary embodiments of the invention may be operated at higher voltages and/or with larger electric currents flowing through the fuse than a conventional fuse.

Exemplary embodiments of the invention further may include an aircraft electric circuit board, in particular an aircraft electric circuit board of an aircraft solid-state power controller, wherein the aircraft electric circuit board is equipped with an electric fuse according to an exemplary embodiment of the invention.

Electric paths may be formed on such a electric circuit board, and the at least one electric conductor may be electrically coupled to two electric paths providing an electric connection between said two electric paths.

The electric circuit board may in particular be a printed electric circuit board.

Exemplary embodiments of the invention also may include an aircraft solid-state power switch module comprising a solid-state power switch mounted to a circuit board, in particular a printed circuit board, by chip-on-board technology ("COB technology") and an electric fuse according to an exemplary embodiment of the invention. In such an embodiment, the solid-state power switch and the at least one electric connector of the electric fuse may be encapsulated by a common potting, i.e. within the same potting material. The common potting may have the configuration of a dam-and-fill potting. The potting may be formed by a suitable polymeric material, e.g. by Loctite Stycast A 316-48, MG Chemicals 9510, or Namics Chipcoat G8345-6.

The common potting may be coated by a polymeric coating as described herein.

Encapsulating the solid-state power switch and the at least one electric connector of the electric fuse within a common potting allows for a very cost efficient manufacturing of the aircraft solid-state power switch module.

Exemplary embodiments of the invention further may include an aircraft comprising an aircraft electric circuit board according to an exemplary embodiment of the invention, and/or an aircraft solid-state power switch according to an exemplary embodiment of the invention.

At a temperature of 25° C., the polymeric coating material may have a density of 1000 to 1100 kg/m3, in particular a density of 1050 to 1080 kg/m3 (8.8 to 9.0 Lbs/gal).

The polymeric coating material may be a resin material comprising two components. Alternatively, or in addition, the polymeric coating material may be a polybutadiene based polymeric material, for example the polymeric coating material may comprise DOLPHON® CB-1128, or may be DOLPHON® CB-1128.

A polybutadiene based polymeric material, for example DOLPHON® CB-1128, has been found as well suited for encapsulating gases and debris that are generated when the at least one electric conductor melts/evaporates, and for reducing the duration of an electric arc, which may be formed between the remaining ends of the at least one electric conductor.

The potting material may have a good heat conductivity and/or good arc discharge energy absorption properties. The arc discharge energy absorption properties may, for example, be achieved by melting mineral fillers.

The potting material may have a low coefficient of thermal expansion coefficient (CTE), for example a CTE below 30 ppm/° C., preferably a CTE below 20 ppm/° C.

The potting encapsulating the at least one electric conductor may be provided as dam-and-fill potting comprising the potting material and a dam material enclosing the potting material.

The dam material as ideally same material base as the potting material, with increased viscosity such as to form a free standing enclosure for the potting material". The dam material may have thixotropic properties. The dam material may be for example "Namics Chipcoat G8345-6".

Forming a dam from an appropriate dam material facilitates the application of the potting material for encapsulating the electric conductor within the polymeric potting material and the polymeric coating material of the deformable polymeric coating.

The at least one electric conductor may be made of metal, such as aluminum. The at least one electric conductor may in particular be a metallic wire. A metallic conductor, in particular a metallic wire, is well suited for providing the desired functionality of melting in case the electric current flowing through the at least one electric conductor exceeds a predefined threshold.

An electric fuse according to an exemplary embodiment of the invention may comprise a plurality of electric conductors. The plurality of electric conductors may be connected in parallel with each other between the electric input terminal and the electric output terminal of the electric fuse.

The predefined threshold current, at which the fuse comprising at least on electric conductor blows and thereby interrupts the electric current flowing through the electric fuse, may be set by selecting the number of electric conductors that are connected in parallel with each other in the respective electric fuse. The predefined threshold current may be increased by increasing the number of electric conductors, and the predefined threshold current may be decreased by reducing the number of electric conductors, which are connected in parallel with each other.

Alternatively or additionally to varying the number of electric conductors, the predefined threshold may be adjusted by changing the material and/or the thickness of the electric conductors of the respective electric fuse.

BRIEF DESCRIPTION OF DRAWINGS

In the following, an exemplary embodiment of an aircraft ground fault detection circuit will be described is described in more detail with reference to the enclosed figures.

FIG. 3A depicts an aircraft electric circuit board of an aircraft solid-state power controller according to an exemplary embodiment of the invention comprising a plurality of aircraft solid-state power switch modules.

FIG. 3B depicts an enlarged detail of FIG. 3A, wherein the polymeric coating is removed.

DETAILED DESCRIPTION

Figure 1:
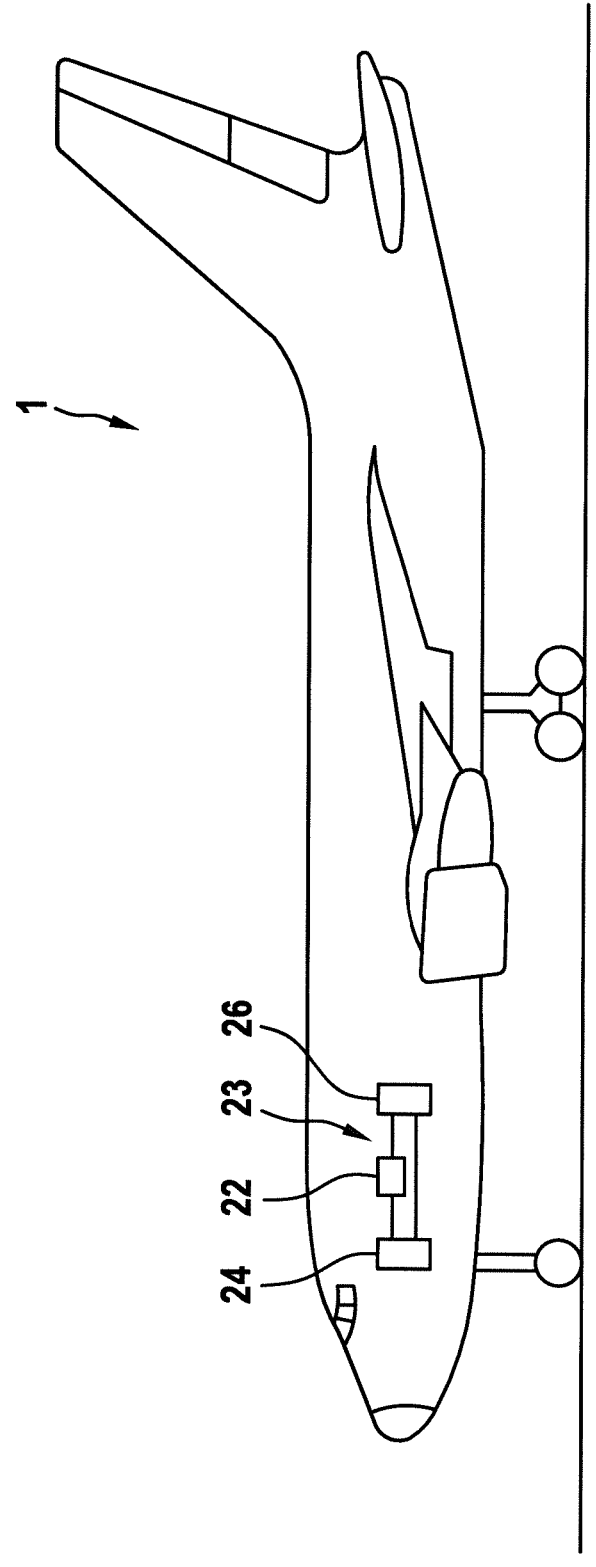
FIG. 1 depicts a schematic side view of an aircraft comprising an aircraft electric power supply system including an aircraft solid-state power controller (SSPC) according to an exemplary embodiment of the invention.

FIG. 1 shows a schematic view of an aircraft 1, in particular of an airplane, which is equipped with an aircraft electric power supply system 23 including an aircraft electric power supply 24, an electric load 26, and an aircraft solid-state power controller (SSPC) 22 according to an exemplary embodiment of the invention, which is configured for controlling the supply of electric power from the aircraft electric power supply 24 to the electric load 26.

Although the aircraft electric power supply system 23 as depicted in FIG. 1 includes only a single aircraft electric power supply 24, a single electric load 26, and a single SSPC 22, respectively, it is to be understood that this is for purpose of illustration only. In practice, embodiments of an aircraft electric power supply system 23 may comprise more the one of each of said components, respectively. Typically, embodiments of an aircraft power supply system 23 may include at least numerous SSPCs and loads assigned to the numerous SSPCs.

An aircraft electric power supply system 23 may in particular include a plurality of SSPCs 22, wherein each SSPC 22 includes numerous SSPC channels.

As a "secondary protection" in case of an electric overload and an error of the SSPC 22, which prevents the SSPC 22 from switching off in order to terminate the electric overload situation, the aircraft electric power supply system 23 is equipped with an electric fuse 2, comprising at least one electric conductor 4, which melts/evaporates in an overload situation thereby interrupting the flow of electricity through the electric conductor and terminating the electric overload situation.

Figure 2:
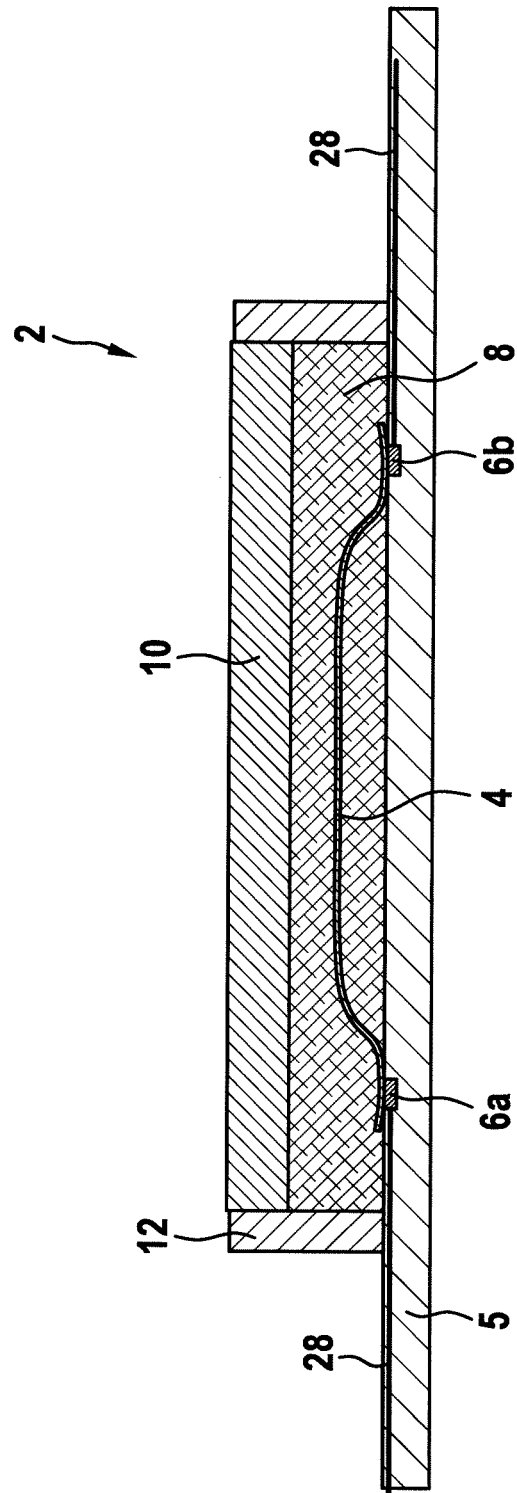
FIG. 2 depicts a schematic sectional view of an electric fuse for an aircraft solid-state power controller according to an exemplary embodiment of the invention.

FIG. 2 depicts a schematic sectional view of an electric fuse 2 for an aircraft solid-state power controller 22 according to an exemplary embodiment of the invention.

The electric fuse 2 comprises at least one electric conductor 4, which is connected between an electric input terminal 6a and an electric output terminal 6b of the electric fuse 2. The electric input terminal 6a and the electric output terminal 6b are provided on a circuit board 5, which may be a printed circuit board (PCB) 5 comprising a plurality of electrically conductive paths 28 and supporting further electric components (not shown), such as solid-state power switches for selectively switching electric currents supplied to electric loads 26.

The at least one electric conductor 4 may be made of metal, for example from aluminium or an alloy comprising aluminium. The at least one electric conductor 4 may in particular be a metallic wire.

The at least one electric conductor 4 is configured to melt and/or evaporate for interrupting an electric current I flowing between the input terminal 6a and the output terminal 6b, when an electric current I flowing through the at least one electric conductor 4 exceeds a predefined threshold current $I_{max}$.

The at least one electric conductor 4 is encapsulated in a polymeric potting 8. The potting 8 comprises a polymeric potting material 9 and configured for dissipating heat produced by the electronic components encapsulated in the potting 8. The potting 8 may also help in absorbing and encapsulating debris that may be generated when the at least one electric conductor 4 melts/evaporates.

The potting material 8 may have a good heat conductivity and/or good arc discharge energy absorption properties. The arc discharge energy absorption arc discharge energy absorption properties may, for example, be achieved by melting mineral fillers.

According to an embodiment of the invention, an outer surface of the potting 8, which is facing away from the circuit board 5, is covered with a polymeric coating 10. The polymeric coating 10 is made from a polymeric coating material as described herein. In particular, the polymeric coating 10 is made from a polymeric coating material being deformable or extensible when subject to stress and/or load (compressive load/stress and/or shear load/stress) and/or heat.

The polymeric coating material 10 is configured for suppressing or preventing that debris from the at least one electric conductor 4 and the potting material 8 is ejected when the at least one electric conductor 4 melts/evaporates or explodes due to an excessive electric overcurrent.

In its final state, after having been applied to an outer surface of the potting 8 and cured, if applicable, the polymeric coating material of the polymeric coating 10 may, be composed, in part or entirely, of elastomeric material with low glass transition temperature, such as to remain flexible (deformation for energy absorption) at high speed of expansion (around 1 ms~1 kHz).

Examples for such elastomeric materials include compounds based on butadiene rubber (BR), polyisoprene rubber (IR), natural rubber (NR), styrene butadiene rubber (SBR), nitrile rubber (NBR), ethylene propylene diene rubber (EPDM); having Young's modulus in the range of 1-10 MPa and elongation at break >>300%

The polymeric coating material of the polymeric coating 10 may have a density of 1000 to 1100 kg/m3, in particular a density of 1050 to 1080 kg/m3 (8.8 to 9.0 Lbs/gal) at 25° C.

The polymeric coating material of the polymeric coating 10 may include a resin material comprising two components. The polymeric coating material of the polymeric coating 10 may be a polybutadiene based polymeric material, in particular the polymeric coating material may, for example, include DOLPHON® CB-1128 or be DOLPHON® CB-1128.

By preventing the potting material 8 from disintegrating when the at least one electric conductor 4 melts due to an electric overcurrent, the polymeric coating material of the polymeric coating 10 may considerable reduce an arcing time Tarc of the electric fuse 2. The arcing time Tarc is the time for which a measurable electric current I is flowing through an electric arc extending between the opposing remaining ends of the disintegrated electric conductor 4, after the electric conductor 4 has blown up.

By applying a polymeric coating 10 according to an exemplary embodiment of the invention, the arcing time Tarc may be reduced to less than ⅟30 of the arcing time measured in the absence of such a polymeric coating 10. In experiments, the arcing time Tarc may, for example, be reduced from approximately 50 ms to approximately 1.5 ms.

In the exemplary embodiment depicted in FIG. 2, the polymeric potting 8 enclosing the electric conductor 4 is provided in the configuration of a dam-and-fill potting, i.e. the potting comprises a polymeric potting material 9 and a polymeric dam material 12 enclosing the polymeric potting material 9.

The polymeric dam material 12 may also enclose the polymeric material of the polymeric coating 10, as depicted in FIG. 2. In an alternative configuration, which is not explicitly shown in the figures, the polymeric coating material of the polymeric coating 10 may coat not only the polymeric potting material 9, but also the polymeric dam material 12.

Figures 3A, 3B:
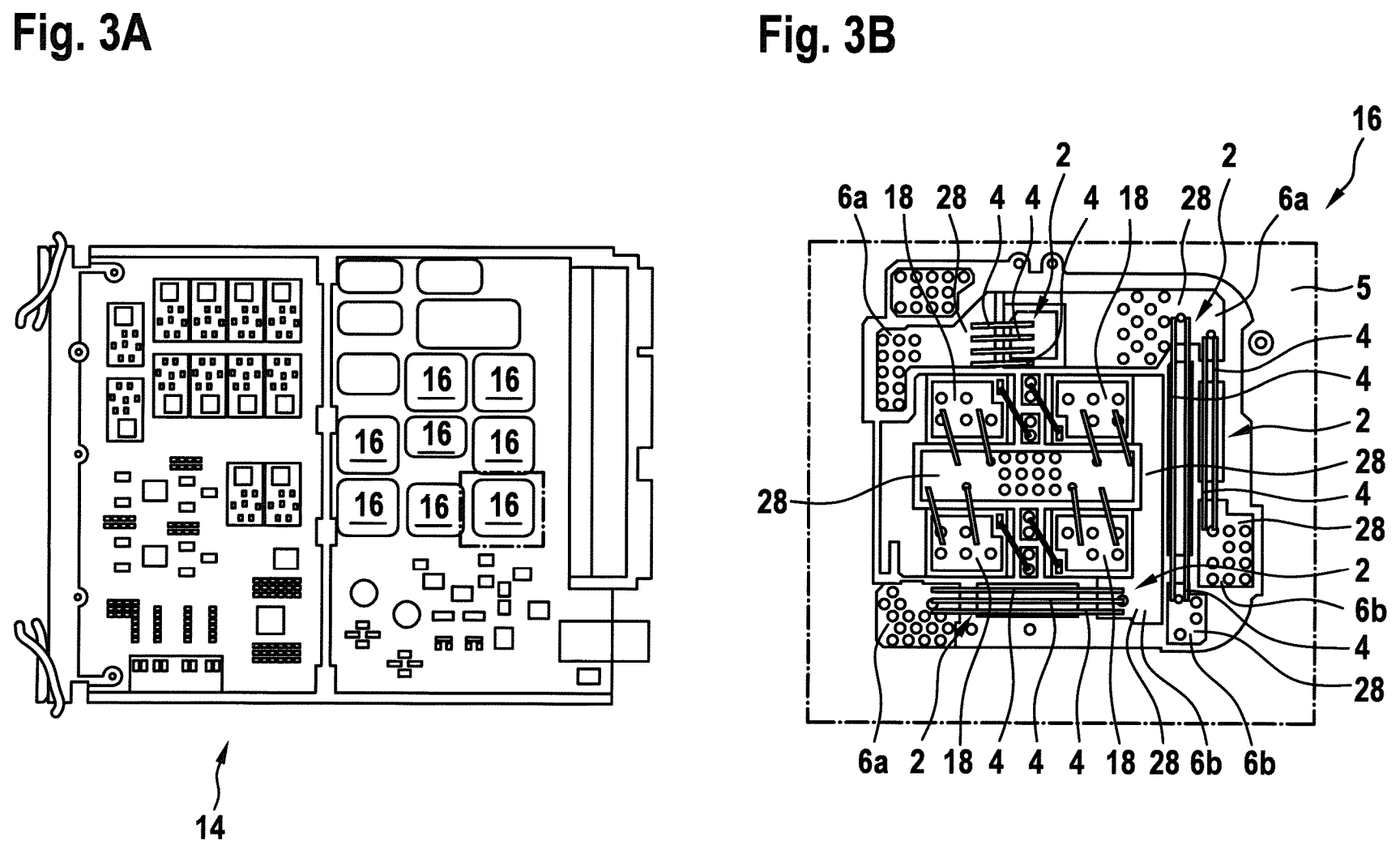

FIG. 3A depicts an aircraft electric circuit board 14 of an aircraft solid-state power controller 22 comprising a plurality of aircraft solid-state power switch modules 16.

FIG. 3B depicts an enlarged detail of FIG. 3A. FIG. 3B depicts in particular an aircraft solid-state power switch module 16 with the polymeric potting 8 and the polymeric coating 10 being removed.

The aircraft solid-state power switch module 16 comprises a plurality of solid-state power switches 18 mounted to the circuit board 5 by chip-on-board ("COB") technology and a plurality of electric fuses 2.

In the embodiment depicted in FIG. 3B, each of the electric fuses 2 comprises two, three or four electric conductors 4, which are connected in parallel between an electric input terminal 6a and an electric output terminal 6b of the respective electric fuse 2.

The predefined threshold current $I_{max}$, at which the electric fuse 2 interrupts the electric current flowing through the fuse 2, may be set by selecting the number of electric conductors 4 that are connected in parallel in the respective electric fuse 2.

Alternatively or additionally, the predefined threshold $I_{max}$ may be varied by changing the material and/or the thickness of the electric conductors 4 of the respective electric fuse 2.

As shown in FIG. 3A, the solid-state power switches 18 and the electric fuses 2 are collectively encapsulated in a common polymeric potting 8. The potting 8 is covered with a polymeric coating 10, as schematically depicted in FIG. 2.

Figure 4:
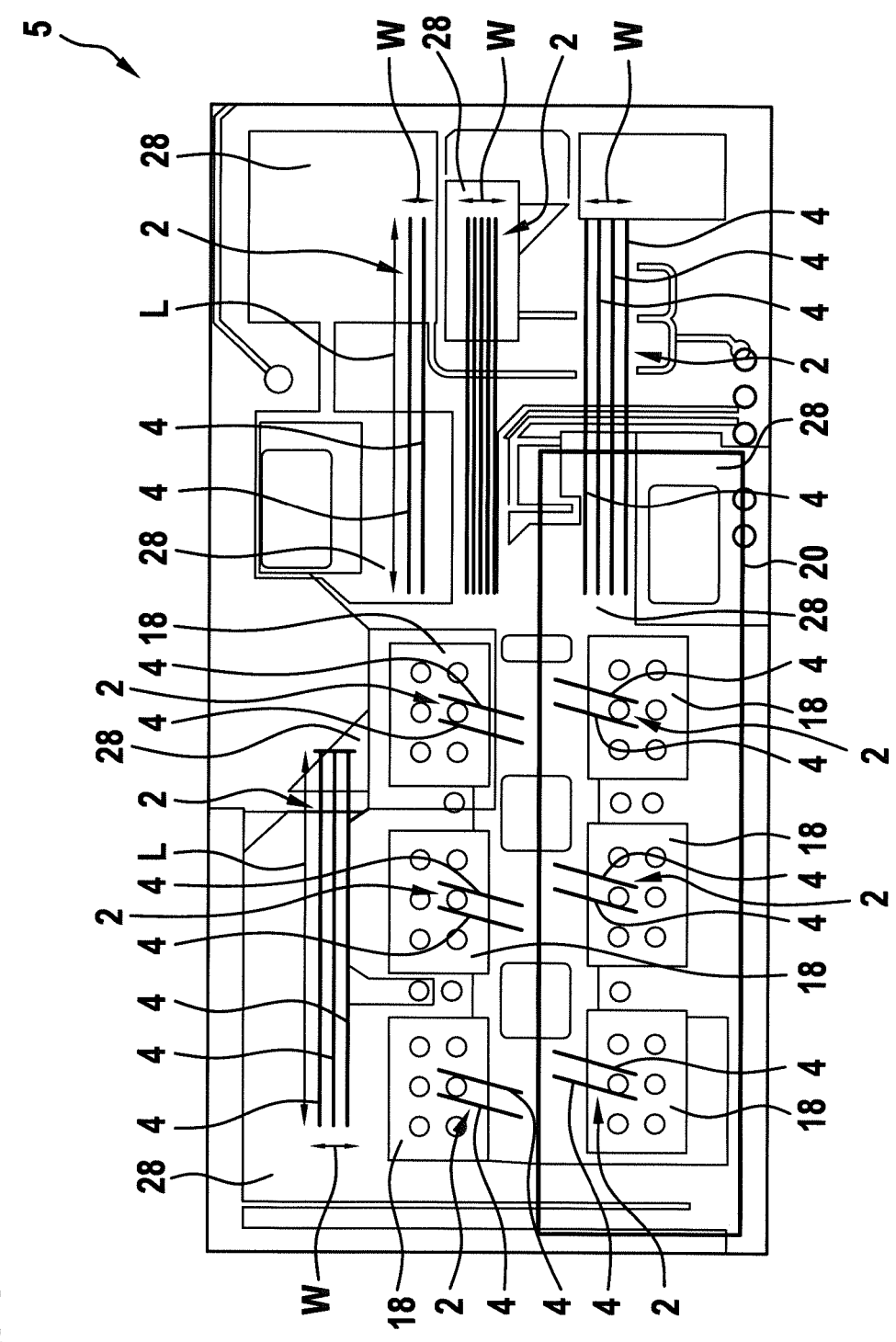
FIG. 4 shows another example of a circuit board that is equipped with a plurality of solid-state power switches and a plurality of electric fuses according to exemplary embodiments of the invention.

FIG. 4 shows another example of a (printed) circuit board 5 that is equipped with a plurality of solid-state power switches 18 and a plurality of electric fuses 2.

The electric fuses 2 depicted in FIG. 4 comprise two, three, four or five electric conductors 4, respectively, which are connected in parallel between an electric input terminal 6a and an electric output terminal 6b of the respective electric fuse 2.

In the exemplary embodiment depicted in FIG. 4, each of the electric conductors 4 has a length L of 19 mm. This length L is, however, only exemplary. The electric conductors 4 may have different lengths L, for example lengths in the range of 10 mm to 30 mm, in particular lengths L in the range of 15 mm to 25 mm.

The width W of the electric fuses 2 in a lateral direction, which is oriented orthogonally to the longitudinal extension of the electric conductors 4, may depend on the number of electric conductors 4 that are connected in parallel to each other. The width W of the electric fuses 2 may be less than 5 mm, the width W of the electric fuses 2 may in particular be in the range of 1 mm to 3 mm, as depicted in FIG. 4.

An electric fuse 2 according to an exemplary embodiment of the invention may in particular be considerably smaller than a conventional fuse 20, which is commercially available of the shelf.

Such a conventional of the shelf fuse 20 is shown for comparison in FIG. 4 as well.

An electric fuse 2 according to an exemplary embodiment of the invention is smaller than a conventional fuse 20 and therefore saves space on the circuit board 5. An electric fuse 2 according to an exemplary embodiment of the invention it is also lighter than such a conventional fuse 20. As a result, the weight of an aircraft solid-state power controller 22 may be reduced by employing electric fuses 2 according to exemplary embodiments of the invention instead of conventional fuses 20. Weight reducing is in particular advantageous in the context of aviation.

Additionally, the costs of the aircraft solid-state power controller 22 may be reduced, since electric fuses 2 according to exemplary embodiments of the invention may be integrated into chip-on-board manufacturing processes that are employed for manufacturing the aircraft solid-state power controller 22.

While the invention has been described with reference to an exemplary embodiment, it will be understood by those skilled in the art that various changes may be made and equivalents may be substituted for elements thereof without departing from the scope of the invention. In addition, modifications may be made to adapt a particular situation or material to the teachings of the invention without departing from the essential scope thereof. Therefore, it is intended that the invention is not limited to the particular embodiment disclosed, but that the invention will include all embodiments falling within the scope of the appended claims.

The invention claimed is:

1. An electric fuse for an aircraft solid-state power controller comprising:
   at least one electric conductor, which is connected between an electric input terminal and an electric output terminal, and which is configured to blow when an electric current (I) flowing through the at least one electric conductor exceeds a predefined threshold $(I_{max})$;
   wherein the at least one electric conductor is encapsulated in a potting comprising a polymeric potting material; and
   wherein at least one outer surface of the potting is covered with a coating comprising a polymeric coating material;
   wherein the potting has the configuration of a dam-and-fill potting, comprising a polymeric potting material and a dam material enclosing the polymeric potting material.

2. The electric fuse according to claim 1, wherein the coating is made from a deformable, extensible, ductile, or elastic polymeric coating material.

3. The electric fuse according to claim 1, wherein the polymeric coating material has a density of 1000 to 1100 kg/m³.

4. The electric fuse according to claim 1, wherein the polymeric coating material is a polybutadiene based polymeric coating material, wherein the polymeric coating material is in particular a polymeric material that is available as DOLPHON® CB-1128.

5. The electric fuse according to claim 1, wherein the polymeric coating material is a two-component resin material.

6. The electric fuse according to claim 1, wherein the potting material has a good heat conductivity and/or, wherein the potting material has good arc discharge energy absorption properties.

7. The electric fuse according to claim 1, wherein the potting material includes mineral fillers.

8. The electric fuse according to claim 1, wherein the at least one electric conductor is an aluminum wire.

9. Aircraft electric circuit board of an aircraft solid-state power controller, the aircraft electric circuit board comprising:
   at least one electric fuse according to claim 1.

10. An aircraft electric circuit board according to claim 9, wherein the board is a printed electric circuit board, comprising:

electric paths, wherein the at least one electric conductor is electrically coupled to two electric paths providing an electric connection between the two electric paths.

11. An aircraft solid-state power switch module comprising:

a solid-state power switch mounted to a circuit board by chip-on-board technology; and an electric fuse according to claim 1, wherein the solid-state power switch and the electric fuse are in particular encapsulated in a common potting.

12. An aircraft comprising:

an aircraft electric circuit board according to claim 9.

13. A method of forming an electric fuse on an aircraft electric circuit board comprising at least two electric paths, the method comprising:

connecting at least two of the electric paths with at least one electric conductor, which is configured to blow when an electric current (I) flowing through the at least one electric conductor exceeds a predefined threshold ($I_{max}$);

encapsulating the at least one electric conductor in a potting comprising a polymeric potting material, wherein the potting has the configuration of a dam-and-fill potting, comprising a polymeric potting material and a dam material enclosing the polymeric potting material; and coating at least one surface of the potting with a coating comprising a polymeric coating material, particularly a deformable, extensible, ductile, or elastic polymeric coating material.

14. An electric fuse for an aircraft solid-state power controller comprising:

at least one electric conductor, which is connected between an electric input terminal and an electric output terminal, and which is configured to blow when an electric current (I) flowing through the at least one electric conductor exceeds a predefined threshold ($I_{max}$);

wherein the at least one electric conductor is encapsulated in a potting comprising a polymeric potting material; and wherein at least one outer surface of the potting is covered with a coating comprising a polymeric coating material;

wherein the at least one electric conductor includes a plurality of electric conductors, which are connected in parallel between the electric input terminal and the electric output terminal.

15. The electric fuse according to claim 14, wherein the coating is made from a deformable, extensible, ductile, or elastic polymeric coating material.

16. The electric fuse according to claim 14, wherein the polymeric coating material has a density of 1000 to 1100 kg/m³.

17. The electric fuse according to claim 14, wherein the polymeric coating material is a polybutadiene based polymeric coating material.

18. The electric fuse according to claim 14, wherein the polymeric coating material is a two-component resin material.

19. The electric fuse according to claim 14, wherein the potting material includes mineral fillers.

* * * * *